US005752216A

United States Patent [19]

Carlson et al.

[11] Patent Number: 5,752,216
[45] Date of Patent: May 12, 1998

[54] NON-INTRUSIVE DATA INTERFACE SYSTEM FOR AIR TRAFFIC CONTROL

[75] Inventors: Kenneth Carlson, Linwood, N.J.; Charles Hucks, Bryan, Tex.

[73] Assignee: Dimensions International, Inc., Alexandria, Va.

[21] Appl. No.: 268,558

[22] Filed: Jul. 6, 1994

[51] Int. Cl.$^6$ .................... G01R 17/02; G06F 3/00

[52] U.S. Cl. .................... 701/117; 364/550; 324/158.1; 371/25.1

[58] Field of Search .................... 364/439, 514, 364/550, 551.01; 73/431, 660; 324/73.1, 158.1, 754; 371/16.1, 25.1, 15.1, 20.1, 26

[56] References Cited

U.S. PATENT DOCUMENTS

| | | | |
|---|---|---|---|
| 2,507,242 | 5/1950 | Bost | 173/324 |
| 2,952,828 | 9/1960 | Dorizzi | 339/18 |
| 3,241,097 | 3/1966 | Ege | 339/198 |
| 3,701,153 | 10/1972 | Gagliardi et al. | 343/17.7 |
| 3,755,785 | 8/1973 | Kirk | 340/172.5 |
| 3,764,995 | 10/1973 | Helf, Jr. et al. | 371/16.1 |
| 3,889,236 | 6/1975 | Herger et al. | 340/172.5 |
| 3,993,996 | 11/1976 | Milan | 343/17.7 |
| 4,066,882 | 1/1978 | Esposito | 324/73.1 |
| 4,161,025 | 7/1979 | Dahy et al. | 395/200 |
| 4,166,289 | 8/1979 | Murtha et al. | 395/200 |
| 4,179,170 | 12/1979 | Splitt et al. | 339/198 |
| 4,213,013 | 7/1980 | Perna et al. | 179/98 |
| 4,247,893 | 1/1981 | Anderson et al. | 395/200 |
| 4,305,076 | 12/1981 | Lepere et al. | 343/17.7 |
| 4,387,433 | 6/1983 | Cardenia et al. | 364/491 |
| 4,393,464 | 7/1983 | Knapp et al. | 395/900 |
| 4,425,617 | 1/1984 | Sherwood | 395/200 |
| 4,425,664 | 1/1984 | Sherman et al. | 340/825 |
| 4,447,873 | 5/1984 | Price et al. | 395/200 |
| 4,481,574 | 11/1984 | DeFino et al. | 395/200 |
| 4,484,263 | 11/1984 | Olson et al. | 395/200 |
| 4,486,833 | 12/1984 | Daudelin | 395/200 |
| 4,491,916 | 1/1985 | Vallhonrat | 395/200 |
| 4,498,716 | 2/1985 | Ward | 371/22 |
| 4,500,958 | 2/1985 | Manton et al. | 395/200 |

(List continued on next page.)

FOREIGN PATENT DOCUMENTS 5791067 6/1982 Japan .

OTHER PUBLICATIONS

Stix, Gary, "Aging Airways", Scientific Amer, May 1994, pp. 96–104.

Malden "Advanced Automation System Common Console Workstation Perspective", 1989 SID Int'l Symposium, pp. 9–14.

Hummel, "Automated Fault Injection for Digital Systems", 1988 Proc. Reliability & Maintainability Symposium, pp. 112–117.

Tench, "A Microcomputer–Based Airspace Ctrl Simulation & Prototype Human –Machine Interface", 1989 IEEE, pp. 1851–1858.

*Primary Examiner*—Gary Chin
*Assistant Examiner*—Tyrone V. Walker
*Attorney, Agent, or Firm*—Penrose Lucas Albright

[57] ABSTRACT

In an air traffic control system, an in-line, data cable interface is disclosed for air traffic control signals which provides data access for use by an external computer system while preventing the disruption of the existing air traffic control signals. The interface provides non-intrusive data access even when the conductors of the data cable interface are short circuited. An external computer system has an associated software program capable of compiling received signals from the in-line data cable interface together with signals from other data sources and displaying the signals in, upon instructions of the user, hexadecimal form, polar graphical form or table form or recording the data onto computer or floppy disk. The air traffic control data is compared with data from another source such as a noise detector to monitor aircraft noise. The system provides a step-by-step method of testing and eventually integrating software and hardware into the existing air traffic control system without disrupting ongoing operations.

40 Claims, 10 Drawing Sheets

U.S. PATENT DOCUMENTS

| | | | |
|---|---|---|---|
| 4,514,815 | 4/1985 | Anderson | 364/478 |
| 4,516,053 | 5/1985 | Crawford | 395/200 |
| 4,544,981 | 10/1985 | Hakoopian | 361/93 |
| 4,575,814 | 3/1986 | Brooks et al. | 395/900 |
| 4,604,682 | 8/1986 | Schwan et al. | 398/200 |
| 4,656,471 | 4/1987 | Hanss et al. | 371/15 |
| 4,696,527 | 9/1987 | Ding et al. | 439/53 |
| 4,706,198 | 11/1987 | Thurman | 364/439 |
| 4,743,887 | 5/1988 | Pothier | 340/531 |
| 4,758,167 | 7/1988 | Bepoix | 439/49 |
| 4,819,235 | 4/1989 | Kelly et al. | 379/1 |
| 4,827,418 | 5/1989 | Gerstenfeld | 364/439 |
| 4,838,814 | 6/1989 | Takai et al. | 439/620 |
| 4,841,456 | 6/1989 | Hogan, Jr. et al. | 364/550 |
| 4,853,839 | 8/1989 | Nichols et al. | 364/559 |
| 4,858,141 | 8/1989 | Hart et al. | 364/483 |
| 4,878,142 | 10/1989 | Bergman et al. | 361/80 |
| 4,920,537 | 4/1990 | Darling et al. | 371/5.1 |
| 4,939,735 | 7/1990 | Fredericks et al. | 371/47.1 |
| 4,949,246 | 8/1990 | O'Dell et al. | 395/200 |
| 4,949,267 | 8/1990 | Gerstenfeld et al. | 364/439 |
| 4,969,819 | 11/1990 | James | 434/5 |
| 4,972,314 | 11/1990 | Getzinger et al. | 395/200 |
| 4,979,137 | 12/1990 | Gerstenfeld et al. | 364/578 |
| 5,014,065 | 5/1991 | Andrieu et al. | 342/165 |
| 5,025,382 | 6/1991 | Artz | 364/439 |
| 5,056,051 | 10/1991 | Tkalcevic | 364/571.05 |
| 5,081,627 | 1/1992 | Yu | 371/29.1 |
| 5,089,816 | 2/1992 | Holmes, Jr. | 340/995 |
| 5,107,456 | 4/1992 | Schuur | 395/325 |
| 5,111,400 | 5/1992 | Yoder | 364/424.01 |
| 5,124,636 | 6/1992 | Pincus et al. | 324/73.1 |
| 5,131,272 | 7/1992 | Minei et al. | 73/431 |
| 5,153,598 | 10/1992 | Alves | 342/352 |
| 5,153,836 | 10/1992 | Fraughton et al. | 364/461 |
| 5,181,027 | 1/1993 | Shafer et al. | 340/961 |
| 5,200,901 | 4/1993 | Gerstenfeld et al. | 364/439 |
| 5,202,639 | 4/1993 | McKeon et al. | 324/158.1 |
| 5,216,611 | 6/1993 | McElreath | 364/454 |
| 5,225,842 | 7/1993 | Brown et al. | 342/357 |
| 5,262,784 | 11/1993 | Drobnicki et al. | 342/45 |
| 5,299,257 | 3/1994 | Fuller et al. | 379/100 |
| 5,311,194 | 5/1994 | Brown | 342/357 |
| 5,321,828 | 6/1994 | Phillips et al. | 395/500 |
| 5,323,164 | 6/1994 | Endo | 342/357 |
| 5,325,100 | 6/1994 | Kawasaki et al. | 342/357 |
| 5,325,302 | 6/1994 | Izidon et al. | 364/461 |
| 5,345,383 | 9/1994 | Vance | 364/550 |
| 5,384,712 | 1/1995 | Oravetz et al. | 364/550 |
| 5,394,458 | 2/1995 | Allen et al. | 379/1 |

NON-INTRUSIVE DATA INTERFACE SYSTEM FOR AIR TRAFFIC CONTROL

FIELD OF THE INVENTION

The invention relates to apparatus and method for providing an air traffic control system with data which is non-intrusively received and formatted by computer hardware and software into selected display arrangements. More particularly, it is directed to the non-intrusive receipt of air traffic control data, and comparing it with other data for purposes such as monitoring aircraft noise.

BACKGROUND OF THE INVENTION

Air Traffic Control is a system that prevents collisions between aircraft, particularly aircraft flying over or near populated areas. Air congestion is most common near airports, where many aircraft of various types may be flying in diverse directions and to distinct destinations at different speeds and altitudes. Air Traffic Control functions, however, to ensure that such aircraft, including private and commercial aircraft flights, are coordinated and proceed safely in an untroubled manner without unnecessary interruptions.

The Air Traffic Control centers are continuously provided with and receive flows of various categories of data such as: flight plan data, flight track data and meteorological data. Flight plan data includes aircraft identification, departure airport and destination airport, route plan, desired cruising level, departure time, and estimated time of arrival. Flight track data comprehends each aircraft's altitude, range, speed and direction of travel. Meteorological information comprises wind speed and direction, visibility, cloud base, air temperature and barometric pressure. All such data received by Air Traffic Control are processed by digital computers to provide the Air Traffic Controllers with the information they need when and as requested. Meteorological data is typically provided from local sources and from meteorological centers.

Noise Abatement Divisions of civil airport authorities require the availability of specific information so that airport noise may be monitored and controlled. Such information includes all publicly relatable aircraft track data which involve a particular geographical area of concern, which, generally, includes the airport and vicinity. Flight track information is currently acquired by the airport's radar system. The geographical area of concern is, however, usually less then that covered by the airport's radar system. Additionally, the Noise Abatement Division comprehends flight plan data that includes identification of the air carrier (if a commercial aircraft), flight number (if a scheduled flight), and aircraft type. Flight plan data must also be correlated with the flight track data. The Noise Abatement Division then uses the correlated flight plan data and flight track data with existing automated noise evaluation systems to evaluate the noise generated in the geographical area of concern.

Furthermore, airport planners, airport operators and local governments are required to address recurring problems of assessing noise impact. The significance of these problems is underscored by increasing public awareness of environmental and safety concerns.

To monitor flight track data and airport noise data successfully, a need exists for a reliable non-intrusive data supply system. The data supply source should provide ready access to the data of interest so it may be recorded and used for monitoring and control purposes. But, it is essential that the data interface be non-intrusive to prevent undesirable and potentially disastrous interference with the air traffic control data requisite for an orderly flow of air traffic.

It is anticipated that the need for a reliable, accurate Air Traffic Control will increase as airline traffic volume continues to grow. Unquestionably, the present system works quite well although parts of the system are quite old. Modernization of a system that must be operational twenty-four hours a day and which has a demonstrated excellent safety record can prudently be introduced with only the greatest care. Testing and implementing new air traffic monitoring systems must be accomplished without disturbance to existing systems. In particular, not only should new, untested computers and computer programs be operated without disruption of ongoing air traffic operations, but their testing and evaluation must include extended periods of parallel employment with existing systems.

Attempts to supersede existing hardware and software applications used in air traffic control by an advanced automation program have been plagued by delays and cost overruns. Moreover, the system is being outpaced by advances in technology. For example, commercial aircraft have onboard processors that can calculate the most advantageous flight paths for fuel efficiency or speed, a capacity which is seldom, if ever, used by air traffic control centers for routing commercial flights. Further, the "NAVSTAR" positioning system can determine the location of an aircraft to within one hundred meters; yet, it is little used in the air traffic control system despite the tremendous advantage it offers. Also, aircraft display modeling and direct-voice inputs provide unique opportunities for interaction with air traffic control system for significant safety and operational advances that are difficult to incorporate into the present air traffic control system, considering its limitations.

An object of this invention is to provide, non-intrusively, from an existing cable, air traffic control data in hexadecimal, polar graphical or tabular form. The invention should provide the necessary data interface and decoding software program while simultaneously it effectively prevents interference with or interruptions to other data flow systems.

A further object of this invention is to provide a parallel, non-intrusive system capable of furnishing previously unavailable data and control into the present air traffic control system for testing and use, temporary or permanent, in parallel or in addition to the existing air traffic control system, without disrupting or in any sense endangering the integrity of the air traffic control system.

SUMMARY OF THE INVENTION

Part of the present invention is directed to a device that provides a non-intrusive interface with an existing data communication cable. The device prevents interference with or interruptions to the existing data flow.

The complete system, however, in addition to the non-intrusive data cable interface, includes a digital personal computer, a custom parallel interface board, a signal repeater card and an associated supporting software program. It, preferably, also includes availability to data sources other than provided through the non-intrusive data cable interface such as, for example, the "NAVSTAR" global positioning system.

The in-line cable connector comprises a double ended enclosure having electrical connections on each end of the enclosure. Each electrical connection on the ends of the enclosure is electrically interconnected within the enclosure by twisted wire pairs. A further electrical interface is provided in which data is transmitted into and from the enclosure via its vertical sides or face. This further electrical interface electrically interconnects to the in-line cable between the two end bulkhead connectors. It also incorporates a protective resistor on each of the plurality of electrical conductors that comprise the electrical interface.

Each of the electrical connectors used on the in-line cable connector may include multiple electrical conductors. On one end of the in-line cable connector, the bulkhead connector provides a plurality of pins that extend upward and normally from the enclosure and on the opposite end of the in-line cable connector a plurality of corresponding sockets is provided which is also arranged external to the enclosure. The second electrical penetrating interface comprises interconnecting mating halves, one half provided with pins and the other being furnished with sockets. The half of the interface that has pins is mounted inside the electrical enclosure. This invention may comprehend multiple second electrical penetrating interfaces. Each conductor attached to the penetrating interface has a series resistance element.

This system provides a non-intrusive interface to satisfy the need to monitor any desired or existing air traffic control data without interfering with or interrupting the data flow of the ongoing system. The complete in-line cable interface is compact and yet houses multiple conductor bundles. The protective resistor elements, provided within the interface circuitry, allow the passage of in-line signals despite a short circuit in the penetrating connection.

Combined with the non-intrusive interface into data carried by an existing in-line cable, the invention is directed to an associated supporting software program that receives, decodes and displays data in hexadecimal, polar graphical or tabular form with the option of recording the data to disk.

The software program receives the string of binary information transmitted from the non-intrusive interface, reads the information by isolating the information bits in it, decodes them and displays the information received in hexadecimal, polar graphical or tabular form with the option of recording the received information to the hard drive. The information bits usually pertain to beacon signals, radar search signals, sector mark signals, alarm signals or weather signals, but this invention comprehends other signals pertaining the air traffic control. It also comprehends the receipt of information in data form which may be provided independently of air traffic control or mixed with data from the in-line cable for testing and evaluation of new systems including new and/or previously unused computer hardware and software systems and arrangements.

These and other features, aspects, and advantages of the present invention will be better understood with regard to the following description, including the appended claims and accompanying drawings wherein:

BRIEF DESCRIPTION OF THE DRAWINGS

FIGS. 4A, 4A-1, 4B, 4C, 4D and 4E are the program operational flow charts for the invention.

DESCRIPTION OF THE PREFERRED EMBODIMENTS

Figure 1:
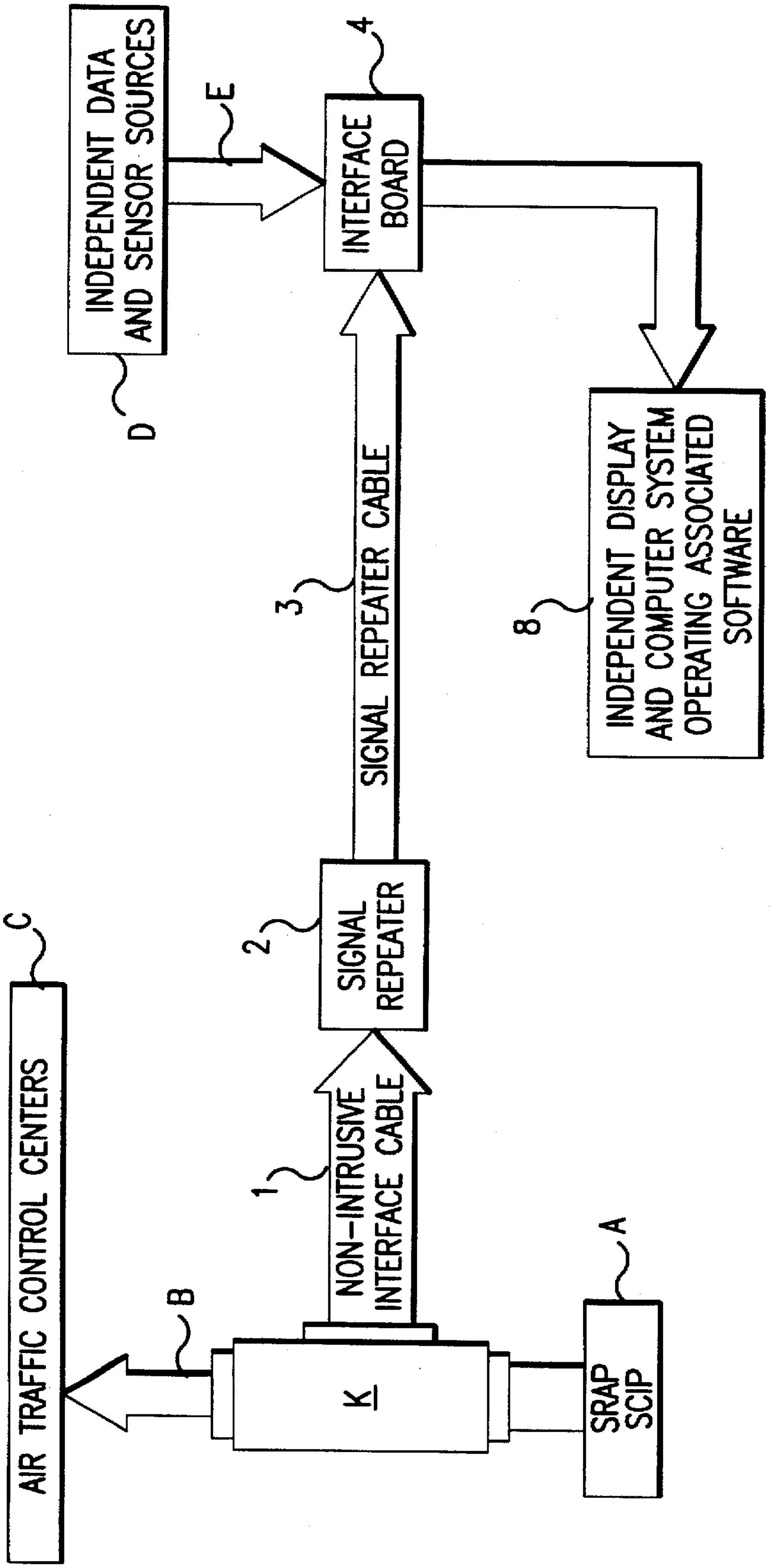
FIG. 1 is a diagrammatic representation of the overall data interface system.

Referring to FIG. 1, in which the overall data interface system is illustrated, non-intrusive data cable interface K is connected to the output connectors of a combined sensor receiver and processor (SRAP) and surveillance and communication interface processor (SCIP) designated by reference character A. The interconnection of A with air traffic control centers, designated by reference character C, is referred to herein as data cable B.

Non-intrusive data cable interface K is interfaced with a signal repeater 2 via a relatively short non-intrusive interface cable 1. Signal repeater 2 provides additional fault protection. Its output signals are capable of transmission up to seventy-five feet along a signal repeater cable 3. Cable 3 is connected to an interface board 4 which transmits data and handshake signals from signal repeater 2 thereto. Cable 3 also provides power to signal repeater 2 from interface board 4.

Interface board 4 receives and buffers bursts of data and transfers them to the internal bus of a computer system 8 at an acceptable rate. Computer system 8 is typically an AT-class machine with a minimum operating speed of twelve MHz. Computer system 8 includes a resident software program that receives user-specified inputs, performs all system initializations, accomplishes data synchronization, recognition, validity checks, reformatting, maintains a user information display, and records the data onto disk. It can also include a plurality of monitors, keyboards and a network.

Figure 2A:
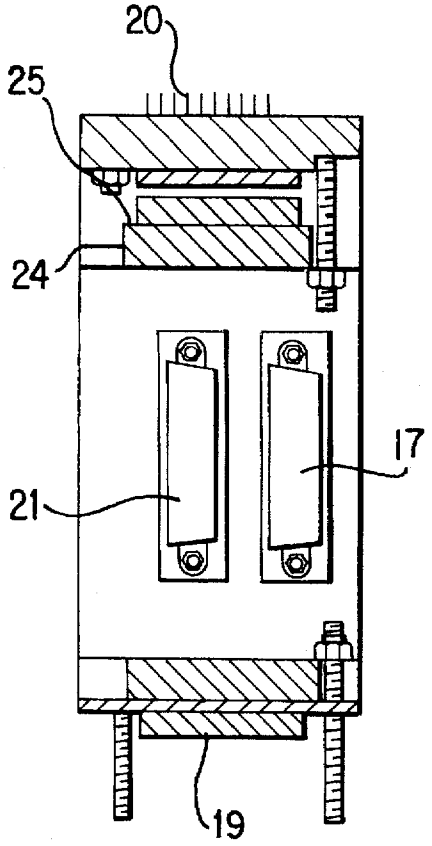
FIGS. 2A and 2B illustrate front and side views respectively, of the in-line, non-intrusive data cable interface housing and its interior, including for clarity only two associated electrical connectors.
Figure 2B:
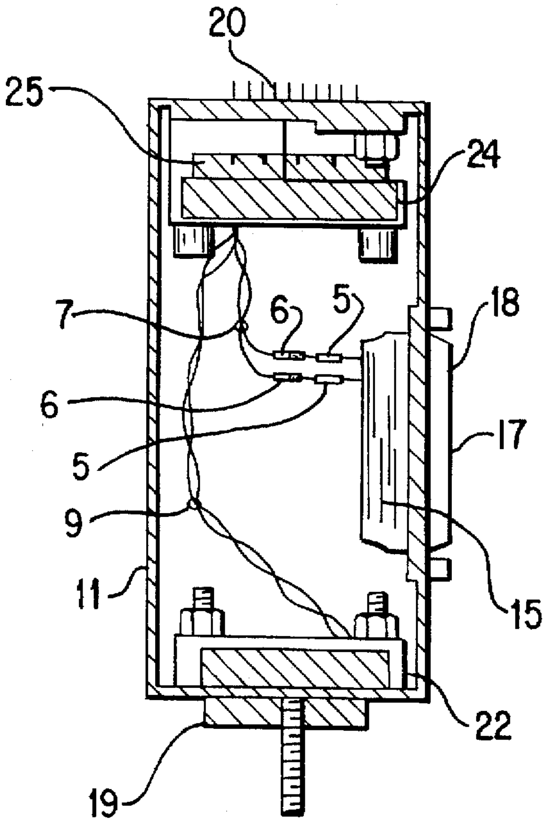

As shown in FIGS. 2A and 2B, a non-intrusive in-line cable connector comprises an enclosure or housing which has mounted thereon an external bulkhead connector 22 with sockets 19 therein below the housing, and a further external bulkhead connector 25 with pins 20 extending vertically above housing 11. A pair of tap connectors 17 and 21 are mounted on housing 11 between bulkhead connectors 22 and 25. These tap connectors include two portions, internal portions 15 that include sockets 16 and 16*a* respectively, (FIG. 3A, 3B and 3C), and an external portions 18.

Bulkhead connector 25 is electrically interconnected to bulkhead connector 22 by insulated conductor pairs 9. Only one of many such pairs is shown in FIG. 2B for clarity. Tap connectors 17 and 21 are electrically interconnected with the bulkhead connector 20 by conductor pairs 7; again only one pair is shown for clarity.

Tap connectors 17 and 21 provide access for, and thus interconnect with, the external data monitoring and recording system of data cable B from the SRAP/SCIP A. Separating tap connectors 17 and 21 from bulkhead connector 25 and the data flow conductors 9 are protective resistors 5. The protective resistors 5 are connected to electrical connection receivers 16 and 16*a* in portions 15 and are connected to conductor pairs 7 via pin connectors 6.

Figure 3A:
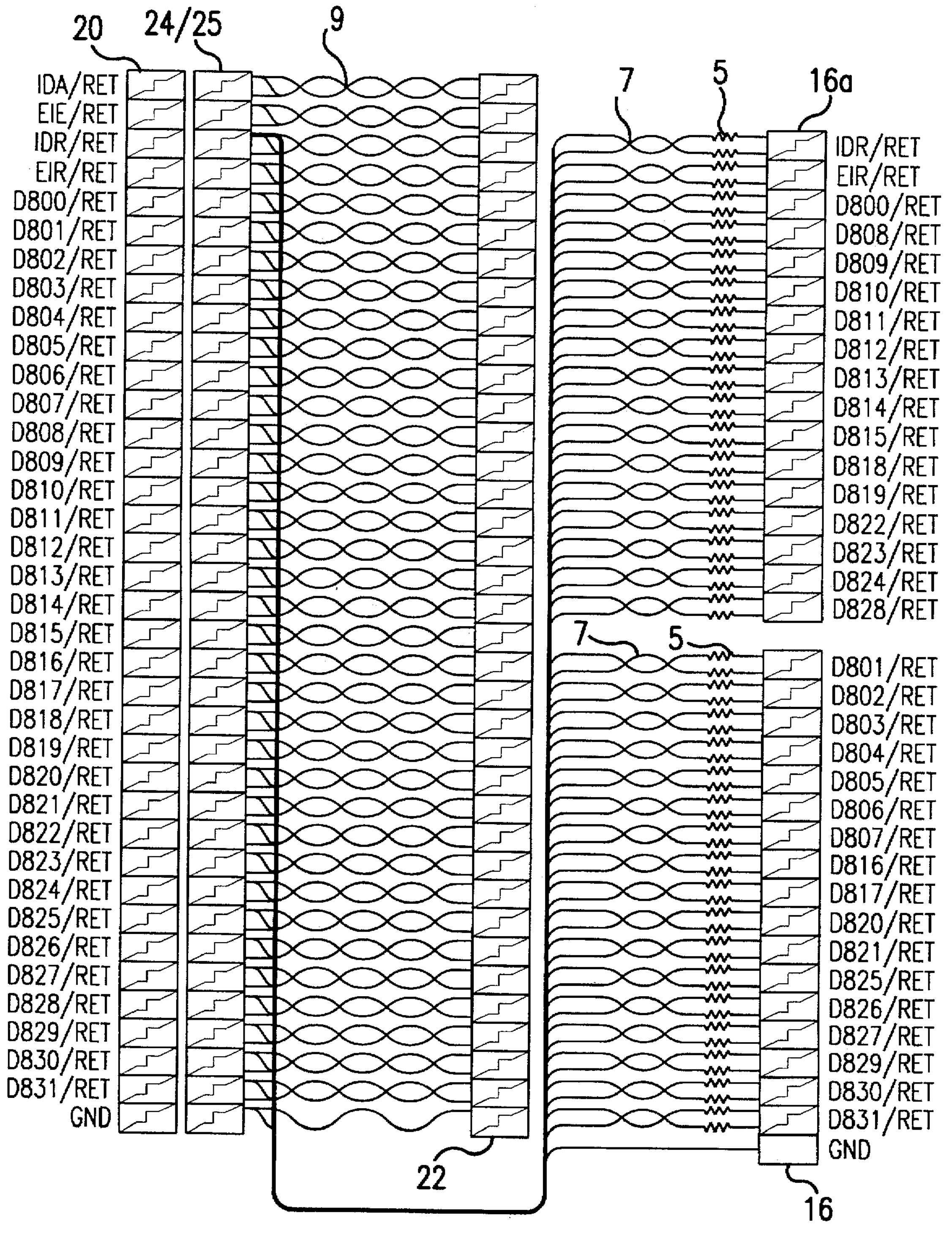
FIG. 3A is a diagrammatic detail of the electrical circuit between the associated electrical connectors.
Figure 3B:
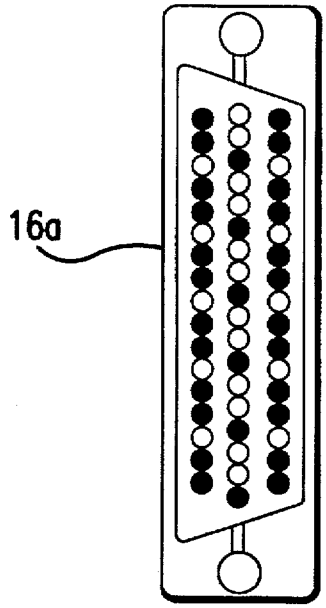
FIGS. 3B and 3C are rear views of connectors mounted in the housing depicted in FIG. 2A.
Figure 3C:
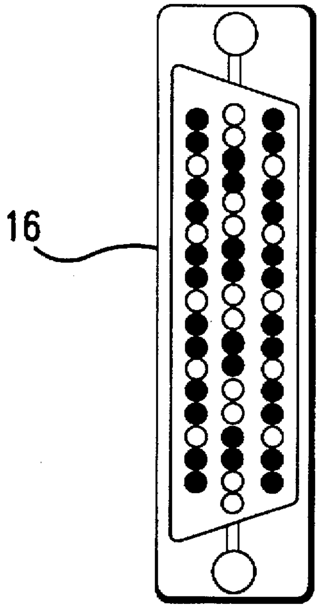
Figure 3D:
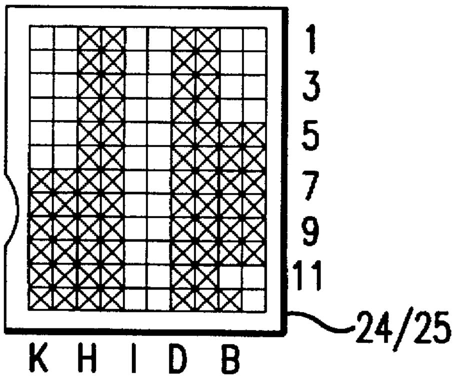
FIG. 3D is an internal representation of the bulkhead connector shown in FIG. 2A.

FIG. 3A illustrates the electrical conductor interconnections within housing 11 in detail. Each of the individual conductors pairs 9 are connected between the facing internal parts of the bulkhead connectors 25 and 22. They comprise, in essence, a portion of the SRAP/SCIP data cable B. Also illustrated in detail are the conductor pairs 7 connected between connection receivers 16 and 16*a* and the internal portion 24 of the bulkhead connector 25, the combination being designated 24/25 in the drawing. The protective isolation resistors 5 are shown connected in series between the connection receivers 16 and 16*a* and the internal portion 24 of the bulkhead connector 25. Illustrating the sockets of the internal portion 24 of the bulkhead connector 25 is FIG. 3D. Sockets of the external portions of tap connectors 17 and 21 are the same as shown in FIGS. 3B and 3C.

Housing 11 is typically constructed of metal. The bulkhead connectors 22 and 25 are removably attached to housing 11. Internal portion 24 (see FIG. 3D) of the bulkhead connector 25 includes solder receptacles used to interconnect the twisted pairs 9 and 7. The connection receivers 16 and 16*a* may also include solder receptacles for the protective isolation resistors 5.

FIGS. 3A, 3B, 3C and 3D disclose in detail the connections between the lower bulkhead connector 22 and internal portion 24 of the upper bulkhead connector 25. Further, the connections of the various twisted wires plus a ground wire, between the internal portion 24 of the upper bulkhead connector 25 and the socket connection members 16 and 16*a* of tap connectors 17 and 21 are also shown.

When used, the in-line, non-intrusive data cable interface K is installed in-line with the existing SRAP/SCIP data cable B at a point near a sensor receiver and processor or a surveillance and communication interface processor. Tap points are provided to cable 1 by the system via the tap connectors 17 and 21 to allow monitoring and recording of existing input and output processor data used by flight control personnel at air traffic control centers.

Cable 1 is received by the signal repeater 2 that, in turn, relays signals to interface board 4 which buffers bursts of data and relays them to the internal bus of the computer system 8 in which operators can receive ongoing and past information from the non-intrusive data using the associated software program. For safety reasons, it is critical that the in-line interface does not interfere with the existing data flow. Protective resistors 5 provide fault isolation from the existing data flow circuitry. If a short circuit should occur anywhere between and including connection members 16 and 16*a* to computer system 8, protective resistors 5 prevent the interruption of the existing data flow. Attention is invited to the following Table 1 that includes short circuit current values in the event that a worst case short circuit should occur in a typical system.

TABLE 1

SHORT-CIRCUIT CURRENT VALUES

| Short type | Isolation | Short-circuit current |
|---|---|---|
| Data line/data line | 2(1.5) = 3 kΩ | −5 V /3 kΩ ≈ 1.7 mA |
| Data line/chassis | 1.5 kΩ | −5 V/1.5 kΩ ≈ 3.3 mA |
| Data line/+5 Vdc | 1.5 kΩ | (−5 V − (5 V))/1.5 kΩ ≈ 6.7 mA |

Table 1 is based on the assumption that each line may provide at least fifty milliamperes of current drive. As indicated by the values in Table 1 the isolation resistors 5, which are each 1.5 K OHMS, effectively prevent the interruption of the existing data flow in the input/output processor data SRAP/SCIP data cable B, irrespective of whether the short is between individual conductors, a conductor or ground (chassis) or a data line and a 5-volt dc source.

The in-line connector transmits the data acquired from the SRAP/SCIP system to signal repeater 2 which is capable of further transmitting the data uncorrupted through up to seventy-five feet of signal repeater cable 3 to interface board 4 that powers the signal repeater and receives and buffers bursts of data and transmits the data to a computer system 8. Interface board 4 is preferably also capable of connecting independently, or additionally, to data sensor sources via communications link E for any number of reasons, including testing for air traffic control purposes. The computer system 8 comprises an International Business Machines, Inc. compatible personal computer operating with an 80286 Central Processing Unit with a minimum speed of 12 MHz, input/output resources with a minimum 640 K Random access memory, a main storage unit capable of supporting at least 4 Megabytes, a monitor and a manually operated keyboard operating under a disk operating system of DOS 2.xx or later versions.

FIGS. 4A through 4E are program operational flowcharts of the associated software programs. The following Table 2 sets forth the programs in pseudocode and is cross-indexed with FIGS. 4A through 4E.

TABLE 2

| PSEUDOCODE | FLOW CHART INDEX |
|---|---|
| INITIALIZE: program | 100 |
| OPEN LIBRARIES: stdlib.h, stdio.h, io.h, dir.h, conio.h, fcntl.h, dos.h, bios.h, math.h, graphics.h, atrain.h | 102 |
| DEFINE: bit pattern on input message | 102 |
| DEFINE & DECLARE: variables & functions | 102 |
| INITIALIZE: variables & arrays | 102 |
| DISPLAY: Title header | 104 |
| READ: Parity Table | 106 |
| DISPLAY: Command Block | 108 |
| IF: Keystroke calls- "Help" | 110 |
| DISPLAY: Help Screens and enable EXIT key | 120 |
| IF: keystroke calls for exit, GO TO 104 | 121 |
| IF: Keystroke calls- "Hex" | 110 |
| DISPLAY: Title block for data presentation in hexadecimal form enable EXIT key | 130 |
| CALL: interrupt subroutine | 200 |
| ADDRESS & READ: interface input data | 202 |
| DEFINE: variables with input | 204 |
| DISABLE: reading of interface input while processing current input | 205 |
| DISPLAY: data | 2221 |
| IF: keystroke calls for exit, GO TO 104 | 131 |
| Scroll screen to display data and GO TO 200 | 132 |
| IF: Keystroke calls- "Rappi" | 110 |
| DISPLAY: Title block for data presentation in polar graphical form and enable exit key | 140 |
| INITIALIZE: graphics programs | 142 |
| INITIALIZE: variables | 142 |
| DISPLAY: Polar Graphics with sweep | 144 |
| CALL: interrupt subroutine | 200 |
| ADDRESS & READ: interface input data | 202 |
| DEFINE: variables with input | 204 |
| DISABLE: reading of interface input while processing current input | 205 |
| IF parity incorrect, correct parity | 208 |
| IF output data not synchronous with input data, GO TO 200 | 210 |
| ELSE: Insert "dummy" status | 212 |
| Read DOS time | 214 |
| Read 32-bit input from interface | 216 |
| Save 32-bit input | 218 |
| Shift message string to ID bits and read | 220 |
| IF MESSAGE: Beacon | 230 |
| IF: Not synchronous, GO TO 200 | 232 |
| Reformat DOS time | 234 |

TABLE 2-continued

| PSEUDOCODE | FLOW CHART INDEX |
| --- | --- |
| IF: Test bit on in message | 236 |
| Make BRTQC label | 240 |
| Else: Make BEACON label | 238 |
| Shift message bits to BEACON data inputs | 242 |
| Read BEACON data and reformat | 242 |
| Increment count of total BEACON signals | 244 |
| IF Message: Radar | 250 |
| IF: Not synchronous, GO TO 200 | 252 |
| Reformat DOS time into program memory | 254 |
| IF: Test bit on in message | 256 |
| Make SRTQC label | 258 |
| Else: Make SEARCH label | 260 |
| Shift message string to SEARCH input bits and read. | 262 |
| Format SEARCH input bits for display | 262 |
| Increment count of total searches | 264 |
| IF Message: ALARM | 270 |
| IF: Not synchronous, GO TO 200 | 272 |
| Reformat DOS time into program memory | 274 |
| Format port # for display | 276 |
| Shift message string to ALARM input bits and read | 278 |
| Format ALARM input bits for display | 278 |
| Clear alarmed processor's message field | 280 |
| Place End-of-Message bit | 280 |
| Increment total ALARM count | 280 |
| IF: Fatal alarm bit set | 281 |
| GO TO 200 | 282 |
| IF Message: SECTOR MARK | 290 |
| IF: Not synchronous | 292 |
| IF: Sector 0 message | 294 |
| IF: North Flag set | 296 |
| Get current DOS time and Go TO 308 | 298 |
| ELSE: Set North Flag, save current time as last sector 0 and Go TO 200 | 300 |
| Save current time as last Sector 0 message | 298 |
| ELSE: GO TO 200 | 301 |
| ELSE: Format DOS time for Display and save | 302 |
| Shift message string to SECTOR MARK input and read | 304 |
| IF SECTOR MARK for sector Zero | 306 |
| Compute time difference since last sector mark 0 message | 308 |
| IF NOT within +/− 10% of scan rate | 310 |
| Reset synchronousity and North flag | 312 |
| Increment NO SYNC count and GO TO 200 | 312 |
| ELSE: GO TO 314 | 310 |
| ELSE: GO TO 314 | 309 |
| Save current time for next Sector 0 check | 314 |
| Make Correct SRTQC label | 315 |
| Clear unused fields and put in Port # | 316 |
| Format SECTOR MARK input data for display | 318 |
| Set End-of-Message Bit and increment total SECTOR MARK COUNT | 319 |
| IF Message: WEATHER | 320 |
| IF: Not synchronous, GO TO 200 | 322 |
| Shift message string to WEATHER input bits and read | 324 |
| Increment TOTAL WEATHER count | 326 |
| GO TO 200 | |
| Write reformatted data to disk buffer | 2242 |
| DISPLAY: data | 2222 |
| IF: keystroke calls for exit, GO TO 104 | 141 |
| GO TO 200 | 330 |

TABLE 2-continued

| PSEUDOCODE | FLOW CHART INDEX |
| --- | --- |
| IF: Keystroke calls- "Preview" | 110 |
| Display: Mode 3 option screen and enable exit key | 152 |
| Read from keyboard Mode 3 target code or "null" code | 154 |
| IF: "Null code" entered GO TO 156 | 154 |
| IF: Mode 3 target code entered | 154 |
| Display Mode 3 target data in nested table and GO TO 156 | 155 |
| Display data and error count in table | 156 |
| CALL: interrupt subroutine | 200 |
| ADDRESS & READ: interface input data | 202 |
| DEFINE: variables with input | 204 |
| DISABLE: reading of interface input while processing current input | 205 |
| IF parity incorrect, correct parity | 208 |
| IF output data not synchronous with input data, GO TO 200 | 210 |
| ELSE: Insert "dummy" status | 212 |
| Read DOS time | 214 |
| Read 32-bit input from interface | 216 |
| Save 32-bit input | 218 |
| Shift message string to ID bits and read | 220 |
| IF MESSAGE: Beacon | 230 |
| IF: Not synchronous, GO TO 200 | 232 |
| Reformat DOS time for Display | 234 |
| IF: Test bit on in message | 236 |
| Make BRTQC label | 240 |
| Else: Make BEACON label | 238 |
| Shift message bits to BEACON data inputs | 242 |
| Read BEACON data and reformat | 242 |
| Increment count of total BEACON signals | 244 |
| IF Message: Radar | 250 |
| IF: Not synchronous, GO TO 200 | 252 |
| Reformat DOS time into program memory | 254 |
| IF: Test bit on in message | 256 |
| Make SRTQC label | 258 |
| Else: Make SEARCH label | 260 |
| Shift message string to SEARCH input bits and read. | 262 |
| Format SEARCH input bits for display | 262 |
| Increment count of total searches | 264 |
| IF Message: ALARM | 270 |
| IF: Not synchronous, GO TO 200 | 272 |
| Reformat DOS time into program memory | 274 |
| Format port # for display | 276 |
| Shift message string to ALARM input bits and read | 278 |
| Format ALARM input bits for display | 278 |
| Clear alarmed processor's message field | 280 |
| Place End-of-Message bit | 280 |
| Increment total ALARM count | 280 |
| IF: Fatal alarm bit set | 280 |
| GO TO 200 | |
| IF Message: SECTOR MARK | 290 |
| IF: Not synchronous | 292 |
| IF: Sector 0 message | 294 |
| IF: North Flag set | 296 |
| Get current DOS time and GO TO 308 | 298 |
| ELSE: Set North Flag, save current time as last sector 0 and GO TO 200 | 300 |
| Save current time as last Sector 0 message | 298 |
| ELSE: GO TO 200 | |
| ELSE: Format DOS time for Display and save | 302 |
| Shift message string to SECTOR MARK input and read | 304 |
| IF SECTOR MARK for sector Zero | 306 |
| Compute time difference since last | 308 |

TABLE 2-continued

| PSEUDOCODE | FLOW CHART INDEX |
|---|---|
| sector mark 0 message | |
| IF NOT within +/− 10% of scan rate | 310 |
| Reset synchronousity and North flag | 312 |
| Increment NO SYNC count and GO TO 200 | 312 |
| ELSE: GO TO 314 | 310 |
| ELSE: GO TO 314 | 306 |
| Save current time for next Sector 0 check | 314 |
| Make Correct SRTQC label | 315 |
| Clear unused fields and put in Port # | 316 |
| Format SECTOR MARK input data for display | 318 |
| Set End-of-Message Bit and increment total SECTOR MARK COUNT | 319 |
| IF Message: WEATHER | 320 |
| IF: Not syncbronous, GO TO 200 | 322 |
| Shift message string to WEATHER input bits and read | 324 |
| Increment TOTAL WEATHER count GO TO 200 | 326 |
| Write reformatted data to disk buffer | 2243 |
| DISPLAY: data | 2223 |
| IF: Keystroke calls for exit GO TO 104 | 153 |
| Go TO 200 | 330 |
| IF: Keystroke calls- "Record" | 110 |
| Initialize variables | 162 |
| Display subdirectory memory record template and enable exit key | 164 |
| Read keyboard input for subdirectory name, time/date and comments | 166 |
| Create subdirectory under name, with time/date and comments | 168 |
| Display: Mode 3 option screen and enable exit key | 152 |
| Read from keyboard Mode 3 target code or "null" code | 154 |
| IF: "Null code" entered GO TO 156 | 154 |
| IF: Mode 3 target code entered | 154 |
| Display Mode 3 target data in nested table and GO TO 156 | 155 |
| Display data and error count in table | 156 |
| CALL: interrupt subroutine | 200 |
| ADDRESS & READ: interface input data | 202 |
| DEFINE: variables with input | 204 |
| DISABLE: reading of interface input while processing current input | 205 |
| IF parity incorrect, correct parity | 208 |
| IF output data not synchronous with input data, GO TO 200 | 210 |
| ELSE: Insert "dummy" status | 212 |
| Read DOS time | 214 |
| Read 32-bit input from interface | 216 |
| Save 32-bit input | 218 |
| Shift message string to ID bits and read | 220 |
| IF MESSAGE: Beacon | 230 |
| IF: Not synchronous, GO TO 200 | 232 |
| Reformat DOS time into Display format | 234 |
| IF: Test bit on in message | 236 |
| Make BRTQC label | 240 |
| Else: Make BEACON label | 238 |
| Shift message bits to BEACON data inputs | 242 |
| Read BEACON data and reformat | 242 |
| Increment count of total BEACON signals | 244 |
| IF Message: Radar | 250 |
| IF: Not synchronous, GO TO 200 | 252 |
| Reformat DOS time into program memory | 254 |
| IF: Test bit on in message | 256 |
| Make SRTQC label | 258 |

TABLE 2-continued

| PSEUDOCODE | FLOW CHART INDEX |
|---|---|
| Else: Make SEARCH label | 260 |
| Shift message string to SEARCH input bits and read. | 262 |
| Format SEARCH input bits for display | 262 |
| Increment count of total searches | 264 |
| IF Message: ALARM | 270 |
| IF: Not synchronous, GO TO 200 | 272 |
| Reformat DOS time into program memory | 274 |
| Format port # for display | 276 |
| Shift message string to ALARM input bits and read | 278 |
| Format ALARM input bits for display | 278 |
| Clear alarmed processor's message field | 280 |
| Place End-of-Message bit | 280 |
| Increment total ALARM count | 280 |
| IF: Fatal alarm bit set GO TO 200 | 280 |
| IF Message: SECTOR MARK | 290 |
| IF: Not synchronous | 292 |
| IF: Sector 0 message | 294 |
| IF: North Flag set | 296 |
| Get current DOS time and GO TO 308 | 298 |
| ELSE: Set North Flag, save current time as last sector 0 and GO TO 200 | 300 |
| Save current time as last Sector 0 message | 298 |
| ELSE: GO TO 200 | |
| ELSE: Format DOS time for Display and save | 302 |
| Shift message string to SECTOR MARK input and read | 304 |
| IF SECTOR MARK for sector Zero | 306 |
| Compute time difference since last sector mark 0 message | 308 |
| IF NOT within +/− 10% of scan rate | 310 |
| Reset synchronousity and North flag | 312 |
| Increment NO SYNC count and GO TO 200 | 312 |
| ELSE: GO TO 314 | 310 |
| ELSE: GO TO 314 | 306 |
| Save current time for next Sector 0 check | 314 |
| Make Correct SRTQC label | 315 |
| Clear unused fields and put in Port # | 316 |
| Format SECTOR MARK input data for display | 318 |
| Set End-of-Message Bit and increment total SECTOR MARK COUNT | 319 |
| IF Message: WEATHER | 320 |
| IF: Not synchronous, GO TO 200 | 322 |
| Shift message string to WEATHER input bits and read | 324 |
| Increment TOTAL WEATHER count Go TO 200 | 326 |
| Write data to subdirectory and close | 170 |
| Write reformatted data to disk buffer | 2244 |
| DISPLAY: data | 2224 |
| IF: Keystroke calls for exit, GO TO 104 | 167 |
| GO TO 200 | 330 |
| IF: Keystroke calls- "EXIT", GO TO DOS | 331 |

A starting instruction 100 initiates the program which then calls library functions, declares and defines variables and subroutines and initiate arrays and variables 102.

The program then displays on the monitor the title header 104 and generates the parity table for parity checks 106. At this time the command block 108 appears on the screen listing the appropriate command keys and signals that the program awaits an appropriate command 110 through the keyboard from the user. The user then selects from the list of appropriate keyboard commands whether the data should be displayed in hexadecimal, polar graphic, non-recorded tabular or recorded tabular form. Upon choosing the appropriate keyboard command, the program proceeds to the appropriate subroutine.

If the user selects, using the appropriate keyboard command, to acquire general information on the program and hardware, various preprogrammed screens 120 are displayed on the monitor screen. Exit back to the title header 104 is enabled and operated by the proper keystroke 121.

If the user selects, using the appropriate keyboard command, the data displayed in hexadecimal form, the program proceeds to the subroutine that displays on the monitor screen the title header for hexadecimal data format 130, then to the subroutine 200 (see FIG. 4B) that addresses and reads the input data 202, defines variables with the input 204, disables the program reading of more data while current data is processed 205 and next proceeds to the subroutine that displays the data 2221, (FIG. 4A-1), and then another subroutine that scrolls the screen for the data 132. The program returns to subroutine 200 until the exit key 131 is pressed returning the program to the title header 104.

If the user decides to have the data displayed in polar graphical form, the program proceeds to initialize graphic programs and variables, then to the subroutine that displays on the monitor a polar graph with a sweep arm rotating across the screen. The program next proceeds to the subroutine 200, (FIG. 4B), that again addresses and reads the input data 202, defines variables with the input 204, disables the program reading of more data while current data is processed 205, checks the parity 208, checks the synchronousity of the input data with the display of data 210, inserts a "dummy" status at the beginning of each scan 212, reads the DOS time 214, puts the time in the correct format of the program 216, rechecks synchronousity 218, and decodes 220 the data by shifting the pointer to the appropriate data location on the binary string input and reading the information encoded at that location on the binary string. The program then reformats the binary information 242, 262 and 278, (FIG. 4C), and 318, (FIG. 4E), writes the data to the buffer disk 2242, (FIG. 4A-1), and displays the data 2222 in polar graphical form. The program then returns to subroutine 200 to repeat the process until the exit key 141 is pressed returning the program to the title header 104.

If the user selects the option of having the data and error count displayed in tabular form, without the option of recording the data to disk, the program proceeds to a subroutine displaying a command block 152 that gives the user the option of having inset into a table of data and error count, tracking data for a particular target identified by a unique code. If the user does not desire this option, the user enters a predefined null code at 154 and the program proceeds to a subroutine 156 that displays on the monitor an appropriate table for the data and error count without a target track information table inset; if the user chooses this option the user enters the unique code at 154 assigned to the target and the program proceeds to subroutine 156 that also displays on the monitor an appropriate table for the data and error count but which now requires a nested target track information table with target track data 155 to be displayed. The program next proceeds to the subroutine 200, (FIG. 4B), that addresses and reads input data 202, defines variables with the input 204, disables the program reading of more data while current data is processed 205, checks the parity 208, checks the synchronousity of the input data with the display of data 210, inserts a "dummy" status at the beginning of each scan 212, reads the DOS time 214, puts the time in the correct format of the program 216, rechecks synchronousity 218, and decodes the data at 220 by shifting the pointer to the appropriate data location on the binary string input and reading the information encoded at that location on the binary string. The program then reformats the binary information 242, 262 and 278, (FIG. 4C) and 318, (FIG. 4E) writes the data to a buffer disk 2243, and displays the data 2223 in tabular form. The program then returns to subroutine 200 to repeat the process until the exit key is pressed 153 returning the program to the title header 104.

Figure 4A:
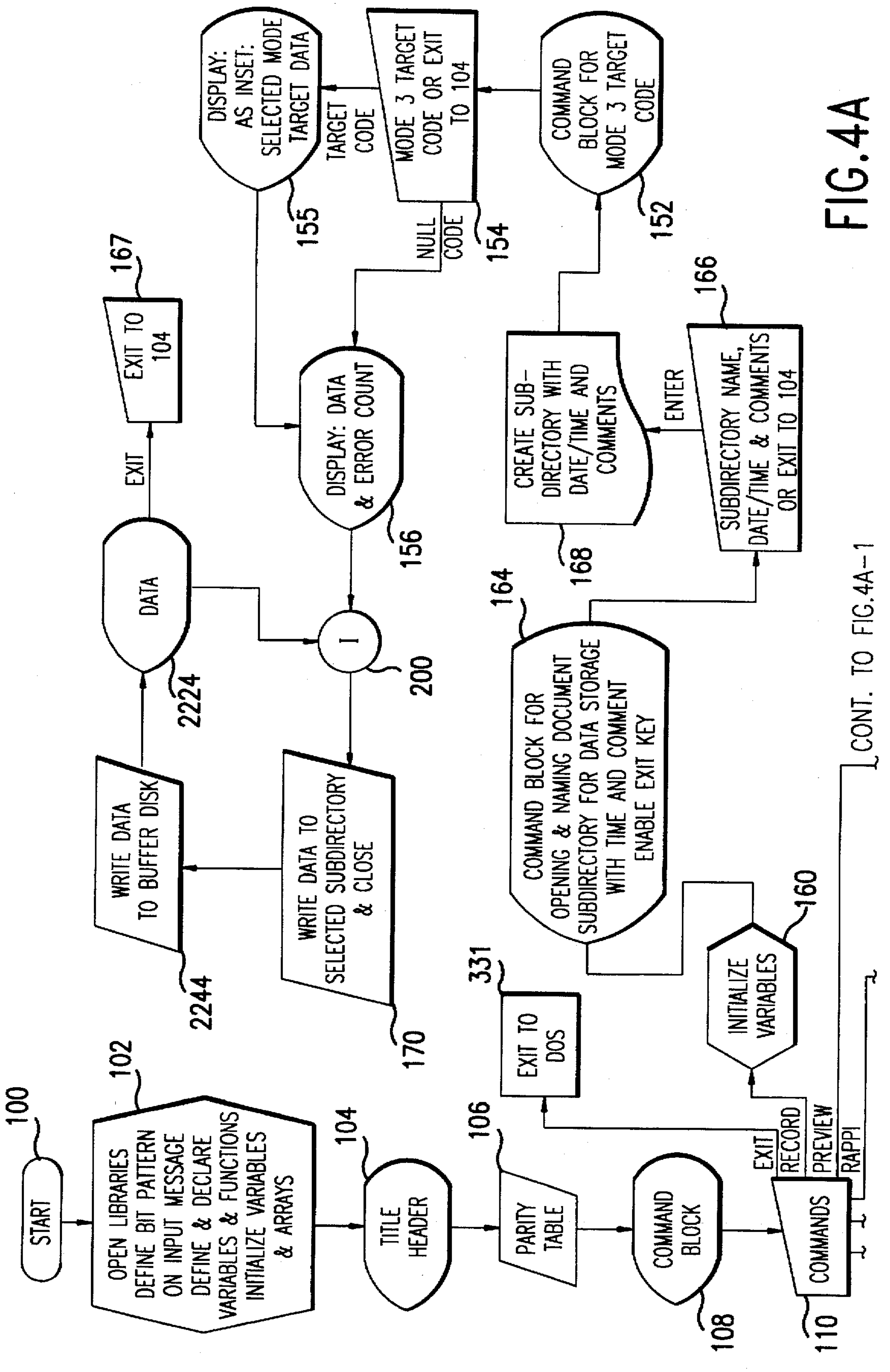
Figures 1, 4A:
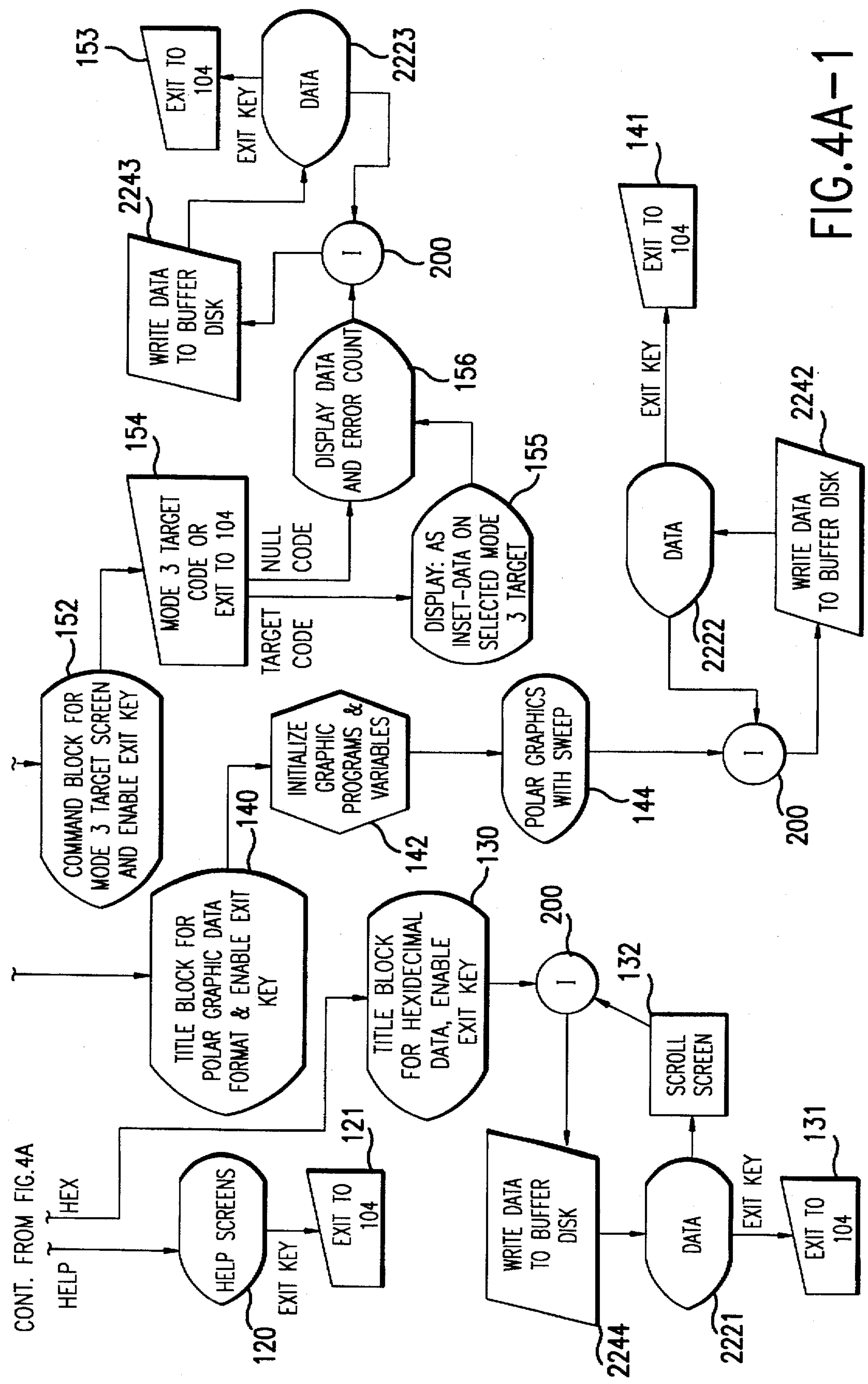
Figure 4B:
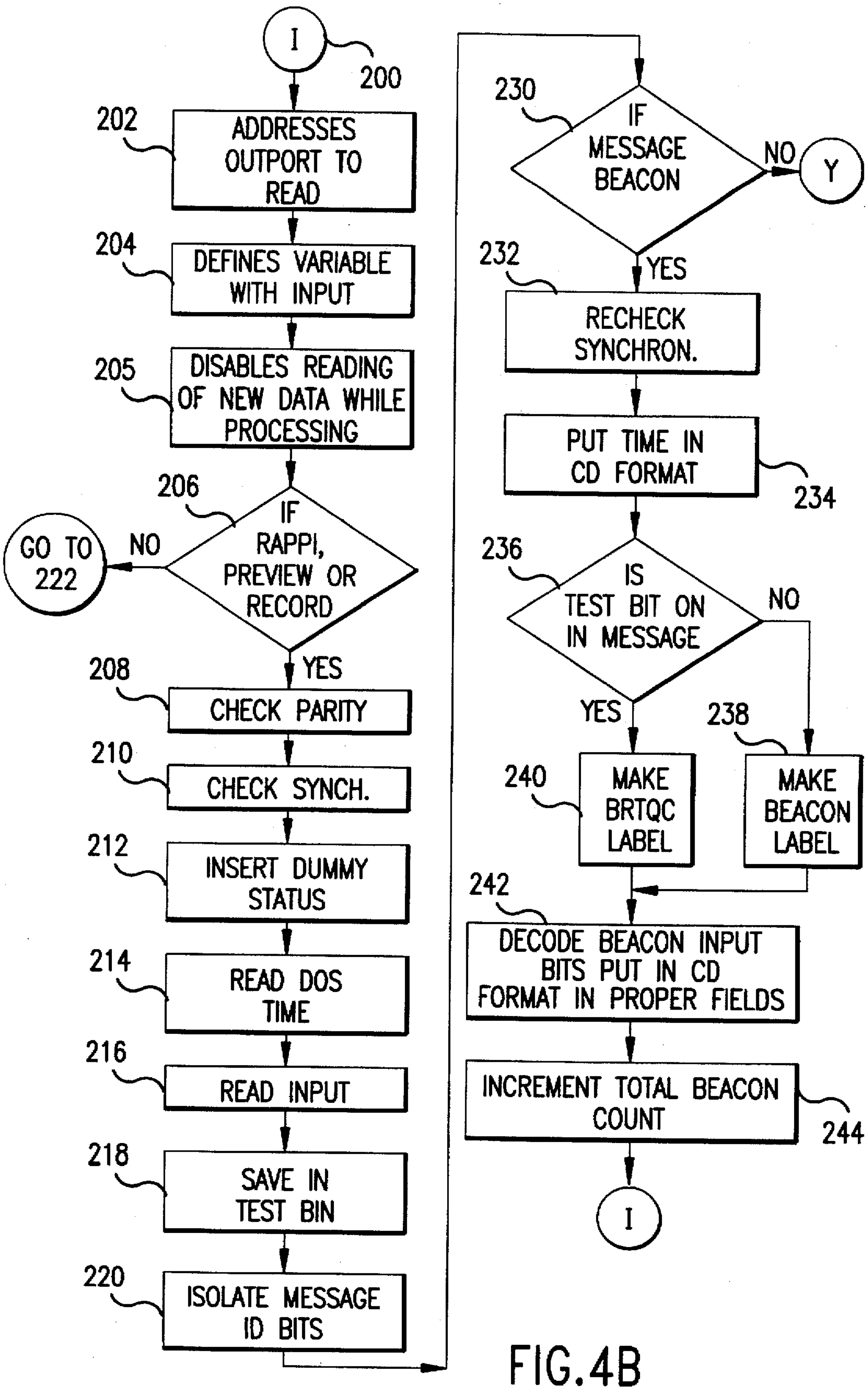
Figure 4C:
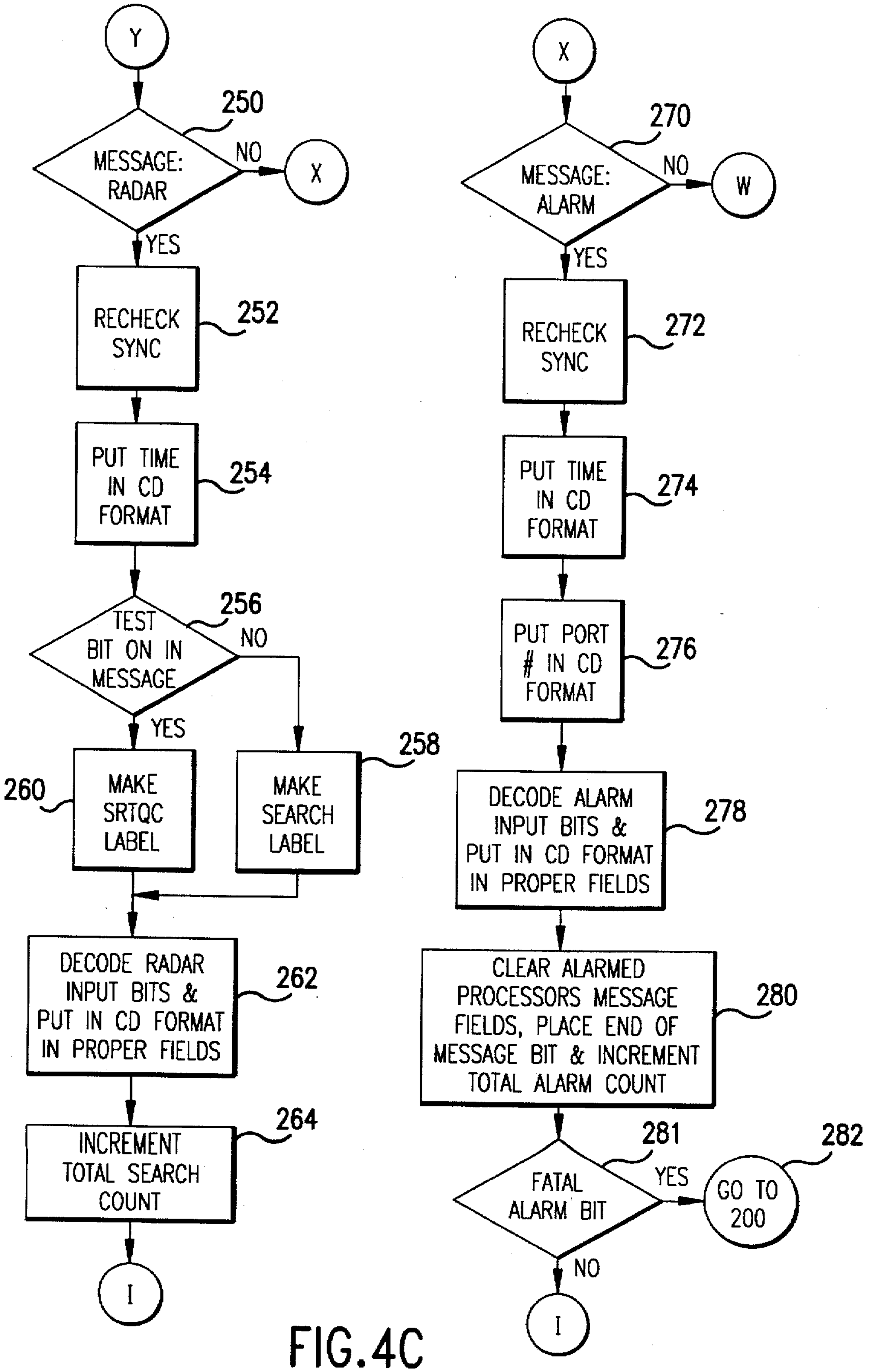
Figure 4D:
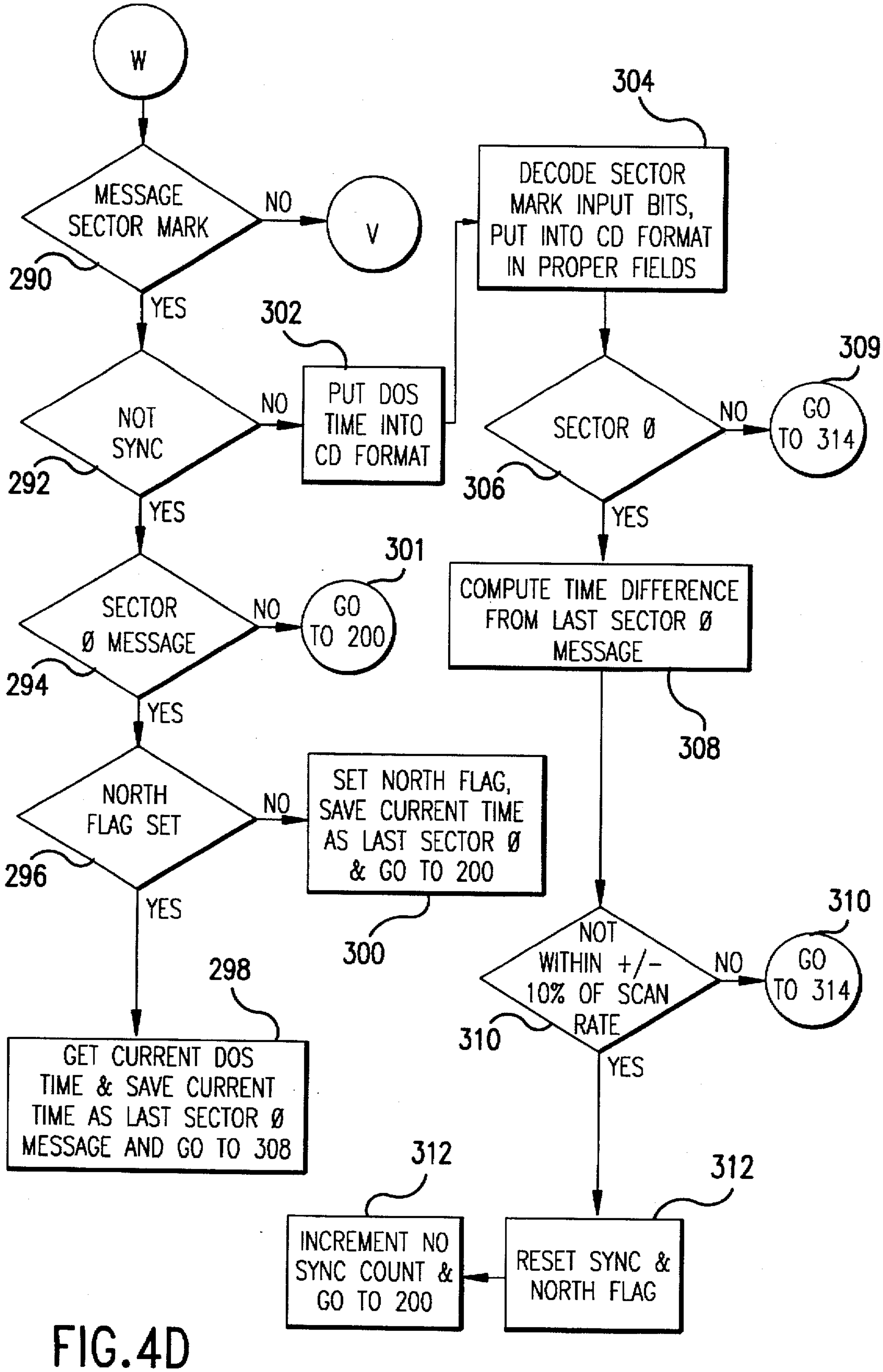
Figure 4E:
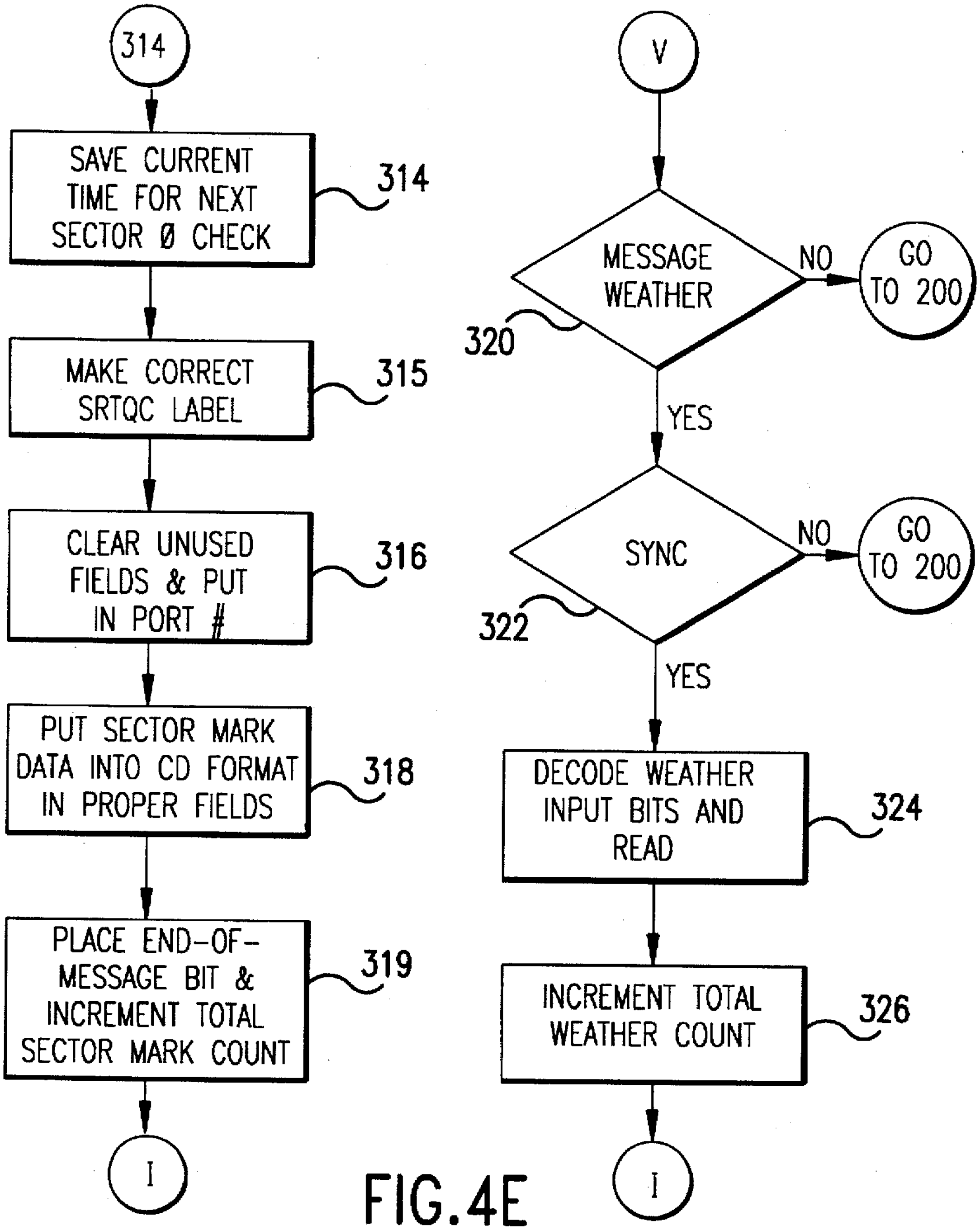

Should the user desire the option of having the data count and error count displayed in tabular form with the further option of recording the data to a document subroutine, the program proceeds first to a subroutine that initializes the variables 160, then a subroutine that displays an appropriate command block 164 for appropriately identifying the document subroutine, inputting its date and time and allowing for input of comments 166. The program next proceeds to open the new document subroutine 168, give it its given name, writes into it the date and time given plus any comments given and prepare it to receive the incoming data. The program then proceeds to a subroutine 152 that displays on the monitor screen an option for the user of receiving tracking data on the monitor screen for a particular target identified by a unique code. If the user does not desire this option, the user enters a predefined null code at 154 and the program proceeds to a subroutine 156 that displays on the monitor an appropriate table for the data and error count without a target track information table inset; if the user chooses this option the user enters the unique code at 154 assigned to the target and the program proceeds to subroutine 156 that also displays on the monitor an appropriate table for the data and error count but which now requires a nested target track information table with target track data 155 to be displayed. The program next proceeds to the subroutine 200, (FIG. 4B), to address and read the input data 202, defines variables with the input 204, disables the program reading of more data while current data is processed 205, checks the parity 208, checks the synchronousity of the input data with the data displayed 210, inserts a "dummy" status at the beginning of each scan 212, reads the DOS time 214, puts the time in the correct format of the program 216, rechecks synchronousity 218, and decodes at 220 the data by shifting the pointer to the appropriate data location on the binary string input and reading the information encoded at that location on the binary string. The program then reformats the binary information 242, 262 and 278, (FIG. 4C), and 318, (FIG. 4E). The program then writes the data at 170 to the appropriate document subroutine and to the buffer disk 2244, data 2224 being presented on the monitor in tabular form. Finally, the program will continue back to subroutine 200 to repeat the process until the exit key 167 is pressed returning the program to the title header 104.

An agent or agents of the Noise Abatement Division of the airport authority concerned may administer the program, although, of course, there may be other users. Normally, the data is displayed on the monitor in polar graphic form, showing all the airborne aircrafts' position in the geographical area of concern on a map of the area with a designated unique code by each aircraft's position mark. Should the agent receive notice of high noise level for a particular area of the geographical area of concern, the agent then detects the aircraft suspected of causing the high noise. If more than one aircraft is in the area of high noise level, the agent, through appropriate keyboard commands, would preview the flight data of the differing aircraft to distinguish, through its altitude and exact position, the offending aircraft; The agent then, through the appropriate keyboard commands, records the offending aircraft's flight plan to an appropriate document subdirectory. Further, if the agent desires information on aspects of the program or the hardware necessary to deliver the program, that agent inputs through the keyboard the necessary command or commands to display on the monitor the appropriate "help" screen or screens. Additionally, if that agent has any question toward the integrity of the system, he or she inputs through the keyboard the necessary command or commands to display on the monitor the incoming data in hexadecimal form and the agent then gauges the integrity of the system from observing the form of the incoming data.

It will thus be noted that air traffic control system data may be integrated with noise abatement data, as well as other data not comprehended by the air traffic control system data. Further, referring to FIG. 1, incoming data can be provided from a source D, which via a communications link E, provides data to interface board 4. Incidentally, in this respect, it will be appreciated that interface board 4, for this purpose, must be capable of integrating data from at least two different sources and presenting the data in a coordinated fashion to computer system 8. For an example of other data that may be provided, a commercial aircraft may determine its location through the "NAVSTAR" Global Positioning System (GPS) by inboard instrumentation, which is instantaneously transmitted to sensor D at the destination or intermediate air traffic control center which, in turn, is transmitted to an air controller via the computer system 8. Further, either with such information or independently thereof, the aircraft's onboard computers and navigation systems may calculate the most efficient flight plan for time and/or fuel consumption, which information is transmitted to the appropriate sensor D and via communications link E and interface board 4 to computer system 8 which has also received other traffic information via tap connectors 17 and 21, (FIG. 2A), cable 1, repeater 2, and interface board 4, (FIG. 1). The data is then inspected and interpreted by the air traffic controller who judges the suitability of the route. Given affirmance, the aircraft proceeds on the most efficient route available, saving time and money without loss of safety. To the extent that this can be integrated stepwise into the present national system of air traffic control, the system as a whole becomes more efficient. Thus, the integration of onboard equipment with air traffic control has the potential of saving the airline industry billions of dollars by reducing fuel use, shortening delays and improving operational efficiencies.

Although the present invention has been described in detail by reference to certain preferred versions thereof, other versions are possible. Therefore, the spirit and scope of the appended claims should not be limited to the description of the preferred versions contained herein.

Having disclosed our invention, what we claim as new and to be secured by Letters Patents of the United States is:

1. A system for providing data access to air traffic control data comprising a non-intrusive data cable interface permanently connected to receive said air traffic control data, a signal repeater receiving said air traffic control data provided from said non-intrusive data cable interface, said repeater providing said received air traffic control data to an interface board, said interface board being operatively connected to a computer, said computer having an associated software program, a sensor for receiving further data from a source other than said air traffic control data, a communications link from said sensor to said computer, and said computer providing a comparison means for comparing said air traffic control data with said further data, wherein said traffic control data are produced by sensor responses which are non-intrusively tapped for input to said comparison means.

2. A computer system as claimed in claim 1 wherein said computer comprises an International Business Machines, Inc. compatible personal computer operating an 80286 Central Processing Unit or newer version with a minimum speed of 12 MHz, input/output resources with a minimum 640 K Random access memory, main storage unit capable of supporting said associated software program, a monitor and a manually operated keyboard operating under a disk operating system of DOS 2.xx or later versions.

3. A system as claimed in claim 1 in which said non-intrusive data cable interface includes multiple electrical conductors.

4. A non-intrusive data cable interface as claimed in claim 1 comprising an enclosure, said enclosure comprising pins extending from outside thereof and the inside of said enclosure including sockets, each said socket being electrically connected to a corresponding said pin.

5. A system as claimed in claim 1, wherein said non-intrusive data cable interface comprises a plurality of conductors, each of which is connected to a further conductor that conducts air traffic control data to said repeater, each said further conductor including a protective resistance element.

6. A system as claimed in claim 5 wherein each said protective resistance element has a resistance of approximately 1.0–2.0 K ohms.

7. A system as claimed in claim 1 comprising an enclosure for said non-intrusive data cable interface, said enclosure composed of a material selected from the group consisting of metals or polymers.

8. A system as claimed in claim 1 which has a data transmission capacity of up to seventy-five feet for transmitting said air traffic control data from said signal repeater to said interface board.

9. A system as claimed in claim 1 comprising means to provide power to said signal repeater for transmitting said received air traffic control data in bursts of data, said interface board receiving and buffering said bursts of data from said signal repeater and transmitting them separately from said further data to said computer.

10. A system as claimed in claim 1 comprising a software program associated with said computer capable of compiling all data received from said interface board and displaying said data, upon instructions of the user, selectively in either hexadecimal form or polar graphical form or tabular form with information of a selected target.

11. A system as claimed in claim 10 wherein said software program upon instructions of the user, records data received from said interface board.

12. For use in a process that non-intrusively receives data from an air traffic control system, wherein said process includes receiving further data from a communications link from which said air traffic control data is isolated, and wherein said process provides a comparison of said data from said air traffic control with said further data and said air traffic control data are produced by sensor responses which are non-intrusively tapped for input;

a non-intrusive connection member to receive said air traffic control data which comprises an enclosure having two ends, an electrical interface on each said end of said enclosure, each said electrical interface connectable and associated with an air traffic control data cable, each of said electrical interfaces being electrically connected by a plurality of conductors which extend through said enclosure, each said electrical interface associated with said air traffic control data cable and connected to each other whereby data carried by said air traffic control data cable passes from one said electrical interface to the other said electrical interface and thence back to said air traffic control data cable without significantly degrading the integrity of said data in said air traffic control data cable, at least one further electrical interface penetrating said enclosure, said further electrical interface being electrically connected to a further plurality of conductors that are interconnected within said enclosure with said first mentioned plurality of conductors, each said conductor of said further plurality of conductors comprising a protective resistor element.

13. For use in a process of non-intrusively detecting and transferring signals comprising air traffic control data to a computer and comparing said signals with signals from other sources, said first mentioned signals produced by sensor responses which are non-intrusively tapped said processing comprising:

connecting each of a plurality of electrical conductors via protective resistance means to a further plurality of electrical conductors in an existing multiple conductor cable that carry data of an air traffic control system, said protective resistance means not significantly interfering with the integrity of signals conducted through each conductor of said further plurality of electrical conductors in said existing multiple conductor cable that carry data of said air traffic control system, and said protective resistance means effectively preventing short circuit current flow between said plurality of electrical conductors and said further plurality of electrical conductors in said existing multiple conductor cable that carry data of said air traffic control system that significantly interferes with said air traffic control data conducted through said further plurality of electrical conductors of said existing multiple conductor cable that carry data of an air traffic control system.

14. A process in accordance with claim 13 including providing in each of said protective resistance value means a resistance of approximately 1.0–2.0 K ohms.

15. A process in accordance with claim 13 including providing said air traffic control data from said further plurality of electrical conductors in said existing multiple conductor cable that carry said data of air traffic control system to said computer.

16. A system for supplementing air traffic control and extending the operational scope of air traffic control which comprises:

a cable comprising a plurality of binary data carriers conducting air traffic data in an air traffic control system, a plurality of non-intrusive interconnections each one of which interconnects with a respective carrier of said plurality of binary data carriers conducting air traffic data for receiving said air traffic data therefrom, a computer system operatively coupled to said binary data carriers via said non-intrusive interconnections for receiving air traffic data therefrom, said computer system receiving air traffic data corresponding to said air traffic data transferred to each said interconnection from its said respective carrier, means for receiving independent data from a source other than said cable conducting air traffic data and providing said independent data to said computer system, means for comparing said air traffic data from said non-intrusive interconnections and said independent data, and means for integrating said air traffic data from said non-intrusive interconnections and said independent data; from said receiving means for the purpose of displaying the combined data.

17. A system in accordance with claim 16 further comprising data storage means for receiving and storing air traffic data together with said independent data.

18. A system in accordance with claim 16 wherein said independent data comprises aircraft location information data relayed from an aircraft to said receiving means via a communication satellite, said location information data having been ascertained by said aircraft from the "NAVSTAR" global positioning system.

19. A system in accordance with claim 16 wherein said independent data comprises aircraft route data generated by a computer on board an aircraft for a proposed route to be flown by said aircraft that provides the shortest time of flight to said aircraft's destination.

20. A system in accordance with claim 16 wherein said independent data comprises a proposed airport approach data relayed from a computer aboard an aircraft that will require the least expenditure fuel by said aircraft in its approach for landing at said aircraft's destination.

21. A system for supplementing air traffic control and extending the operational scope of air traffic control which comprises:

a cable comprising a plurality of binary data carriers conducting air traffic data, a plurality of non-intrusive interconnections each one of which interconnects with a respective carrier of said plurality of binary data carriers conducting air traffic data for receiving said air traffic data therefrom, a computer system operatively coupled to said binary data carriers via said non-intrusive interconnections for receiving air traffic data therefrom, said computer system receiving air traffic data corresponding to said air traffic data transferred to each said interconnection from its said respective carrier, means for independent data from a source other than said cable conducting air data and providing said independent data to said computer system, means for comparing said air traffic data from said non-intrusive interconnections and said independent data, means for integrating said air traffic data from said non-intrusive interconnections and said independent data from said comparing means for the purpose of displaying the combined data, said independent data comprising data associated with noise monitoring systems for environmental protection.

22. An apparatus providing data access to air traffic monitoring systems comprising:

a non-intrusive data cable interface associated with a primary cable which substantially continually transmits air traffic control data flow and said air traffic control data flow being substantially without error, said non-intrusive data cable interface transmitting said air traffic control data flow to a branch cable, said non-intrusive data cable interface comprising means for substantially preventing disruption of current flow in said primary cable emanating from said branch cable in such amount to effectively block significant corruption of said air traffic control data flow in said primary cable.

23. An apparatus as claimed in claim 22 wherein said air traffic control data flow transmitted by said non-intrusive data cable interface to said branch cable is received by a computer, said computer including means of displaying data from said air traffic control data flow.

24. An apparatus as claimed in claim 22, wherein, said means for substantially preventing disruption from said branch cable of said current flow in said primary cable in the amount whereby said significant corruption of said air traffic control data flow in said primary cable is effectively blocked comprises electrical resistance means.

25. A method of safely improving an air traffic control system comprising:

tapping into an existing air traffic data carrier cable with a non-intrusive data cable interface wherein said air traffic control data conducted through said existing air traffic data carrier cable are substantially unerring, preventing air traffic data conducted through said existing air traffic data carrier cable from being substantially degraded by undue diversions of said air traffic data to said non-intrusive data cable interface, receiving in a further system said air traffic data tapped from said existing air traffic data carrier cable via said non-intrusive data cable interface, said air traffic data produced by sensor responses which are non-intrusively tapped from said existing air traffic data carrier cable, and testing components of said further system for integration into said air traffic control system.

26. A method of safely improving an air traffic control system comprising:

tapping into an existing air traffic data carrier cable with a non-intrusive data cable interface, preventing data conducted through said existing air traffic data carrier cable from being substantially degraded by undue diversions of said data to said non-intrusive data cable interface, receiving in a further system data taped from said existing air traffic data carrier cable via said non-intrusive data cable interface, and testing components of said further system with said tapped data for integration into said air traffic control system, said components of said further system including a computer for said testing for integration into said air traffic control system.

27. A method of safely improving an air traffic control system comprising:

tapping into an existing air traffic data carrier cable with a non-intrusive data cable interface, preventing data conducted through said existing air traffic data carrier cable from being substantially degraded by undue diversions of said data to said non-intrusive data cable interface, receiving in a further system data tapped from said existing air traffic data carrier cable via said non-intrusive data cable interface, and testing components of said further system with said tapped data for integration into said air traffic control system, said components of said further system including a computer software program for said testing for integration into said air traffic control system.

28. A method of safely improving an air traffic control system comprising:

tapping into an existing air traffic data carrier a with a non-intrusive data cable interface, preventing data conducted through said existing air traffic data carrier cable from being substantially degraded by undue diversions of said data to aid non-intrusive data cable interface, receiving in a further system data taped from said existing air traffic data carrier cable via said non-intrusive cable interface, and testing components of said further system with said tapped data for integration into said traffic control system, said components of said further system including a source of air traffic data, other than that transmitting through said existing air traffic data carrier cable, for said testing for integration into said air traffic control system.

29. An apparatus for providing access to air traffic data from an air traffic control system for noise pollution monitoring comprising:

a non-intrusive data cable interface tapping into a cable of said air traffic control system and receiving therefrom said air traffic data, said air traffic data comprising data associated with a track of an aircraft, said non-intrusive data cable interface comprising electric resistance means for performing the function of preventing significant impairment, due to said tapping, of communications of said air traffic data in said cable whereby the operation of said air traffic control system is substantially and detrimentally enervated, said non-intrusive data cable interface providing said tapped data to a computer, said computer displaying said air traffic data, a noise pollution monitoring means concurrently providing information associated with aircraft noise level in an area comprising at least part of the area monitored by said air traffic control system, said apparatus providing means of correlating said aircraft noise level information with said data associated with said track of an aircraft.

30. An apparatus as claimed in claim 29 wherein said electric resistance means has a resistance value in a range from approximately one thousand ohms to approximately two thousand ohms.

31. An apparatus as claimed in claim 29 wherein said computer comprises an IBM compatible personal computer operating an 80286 Central Processing Unit or newer version with a minimum speed of 12 MHz, input/output resources with a minimum 640 K Random access memory, a main storage unit capable of supporting said associated software program, a monitor and a manually operated keyboard selectively operating under a disk operating system of DOS 2.xx or later version.

32. An apparatus as claimed in claim 29 further comprising a software program associated with said computer for compiling all data received from said non-intrusive data cable interface and displaying said data, upon instructions of the user, selectively in either hexadecimal form or polar graphical form or tabular form with information on a selected target.

33. An apparatus as claimed in claim 32 wherein said software program, upon instructions of the user, records data received from said non-intrusive data cable interface.

34. An apparatus as claimed in claim 32 wherein said non-intrusive data cable interface comprises an enclosure, said enclosure comprising an input connector, a first output connector, a second output connector, a conductor and a branch conductor, said input connector extending outside said enclosure for connecting said non-intrusive data cable interface to said cable for receiving input to said non-intrusive data cable interface of said air traffic data from said cable, said input connector electrically connected to said first output connector via a conductor extending through said enclosure, said first output connector extending outside said enclosure for connecting said non-intrusive data cable interface to said cable for transmitting to said cable said air traffic data which is received by said input connector, said input connector further electrically connected to said second output connector via said branch conductor disposed within said enclosure, said branch conductor comprising said electric resistance means, said second output connector extending outside said enclosure for transmitting said air traffic data, via electrical connection, to said computer.

35. An apparatus as claimed in claim 34 wherein said enclosure is composed of a material selected from a group consisting of metals or polymers.

36. An apparatus as claimed in claim 34 wherein said cable comprises a plurality of electrical lines, said input connector comprises a plurality of input connectors corresponding to said plurality of electrical lines, said first output connector comprises a plurality of first output connectors corresponding to said plurality of electrical lines, said second output connectors comprises a plurality of second output connectors corresponding to said plurality of electrical lines, said conductor comprises a plurality of conductors corresponding to said plurality of electrical lines, and said branch conductor comprises a plurality of branch conductors corresponding to said plurality of electrical lines.

37. An apparatus as claimed in claim 29 wherein said tapped data is provided to said computer via an amplifier.

38. An apparatus as claimed in claim 29 further comprising:

means for input to said computer at least part of said information provided by said noise pollution monitoring means.

39. An apparatus providing data access to air traffic monitoring systems comprising:

a non-intrusive data cable interface associated with a primary cable which transmits air traffic control data flow and said air traffic control data flow being produced by sensor responses which are non-intrusively tapped, said non-intrusive data cable interface transmitting said air traffic control data flow to a branch cable.

said non-intrusive data cable interface comprising means for substantially preventing disruption of current flow in said primary cable emanating from said branch cable in such amount to effectively block significant corruption of said air traffic control data flow in said primary cable, said air traffic control data flow transmitted by said non-intrusive data cable interface to said branch cable being amplified by amplification means.

40. An apparatus as claimed in claim 23, wherein, said computer further comprises means of receiving data flow other than said air traffic control data flow transmitted by said non-intrusive data cable interface and, means for displaying such other data from said other data flow.

* * * * *